(12) United States Patent
Kassanoff et al.

(10) Patent No.: US 10,342,332 B2
(45) Date of Patent: Jul. 9, 2019

(54) MODULAR SHELVING SYSTEMS AND METHODS

(71) Applicant: Paragon Furniture, Inc., Arlington, TX (US)

(72) Inventors: Richard Kassanoff, Dallas, TX (US); Robert Larry Stewart, Grapevine, TX (US); James Battley, Fort Worth, TX (US)

(*) Notice: Subject to any disclaimer, the term of this patent is extended or adjusted under 35 U.S.C. 154(b) by 0 days.

(21) Appl. No.: 15/810,608

(22) Filed: Nov. 13, 2017

(65) Prior Publication Data

US 2018/0064246 A1 Mar. 8, 2018

Related U.S. Application Data

(63) Continuation of application No. 14/993,992, filed on Jan. 12, 2016, now Pat. No. 9,814,310, which is a continuation of application No. 13/689,368, filed on Nov. 29, 2012, now Pat. No. 9,237,803.

(60) Provisional application No. 61/721,965, filed on Nov. 2, 2012, provisional application No. 61/565,414, filed on Nov. 30, 2011.

(51) Int. Cl.
| | | |
|---|---|---|
| A47B 47/00 | (2006.01) |
| A47B 87/00 | (2006.01) |
| H05K 5/00 | (2006.01) |
| A47B 47/03 | (2006.01) |
| A47B 47/05 | (2006.01) |
| A47B 57/30 | (2006.01) |
| A47B 83/00 | (2006.01) |
| H05K 7/14 | (2006.01) |
| A47B 57/40 | (2006.01) |

(52) U.S. Cl.
CPC .......... *A47B 47/0091* (2013.01); *A47B 47/03* (2013.01); *A47B 47/05* (2013.01); *A47B 57/30* (2013.01); *A47B 83/001* (2013.01); *A47B 87/00* (2013.01); *H05K 5/0017* (2013.01); *H05K 7/14* (2013.01); *A47B 57/40* (2013.01); *A47B 83/00* (2013.01)

(58) Field of Classification Search
CPC ....... A47B 23/02; A47B 23/025; A47B 23/04; A47B 23/041; A47B 47/0091; A47B 47/03; A47B 47/05; A47B 57/30; A47B 57/40; A47B 83/00; A47B 83/001; A47B 87/00; H05K 5/0017; H05K 7/14
See application file for complete search history.

(56) References Cited

U.S. PATENT DOCUMENTS

| | | | | |
|---|---|---|---|---|
| 2,289,861 A | * | 7/1942 | Backus | ...................... E04H 3/04 297/158.1 |
| 3,570,418 A | * | 3/1971 | Gooding | ................. A47C 4/022 108/12 |
| 4,057,244 A | * | 11/1977 | Gaspar | ................... A47B 83/02 108/25 |
| 4,312,086 A | * | 1/1982 | Bianco | ................... A47B 83/00 108/108 |

(Continued)

*Primary Examiner* — Hanh V Tran
(74) *Attorney, Agent, or Firm* — Ferguson Braswell Fraser Kubasta PC; Elizabeth Philip Dahm; Kelly J. Kubasta

(57) ABSTRACT

A modular shelving system may include a plurality of configurable components and methods of forming configuration assemblies from such components. The configuration assemblies of the modular shelving system may be paired with and coupled to other shelving units and/or furniture.

20 Claims, 13 Drawing Sheets

(56) References Cited

U.S. PATENT DOCUMENTS

| | | | | |
|---|---|---|---|---|
| 4,709,640 A * | 12/1987 | Jouanin | A47B 47/0041 | 108/181 |
| 4,763,580 A * | 8/1988 | Garland | A47D 1/004 | 108/91 |
| 4,961,607 A * | 10/1990 | Marshall, Sr. | B60P 3/32 | 296/156 |
| 5,082,329 A * | 1/1992 | Mars | A47C 4/02 | 108/180 |
| 5,466,058 A * | 11/1995 | Chan | A47B 47/0075 | 312/107 |
| 5,601,348 A * | 2/1997 | Minkovski | A47B 83/04 | 108/42 |
| 5,754,995 A * | 5/1998 | Behrendt | A47B 85/00 | 312/240 |
| 5,983,420 A * | 11/1999 | Tilley | A47B 13/02 | 108/91 |
| 7,040,695 B2 * | 5/2006 | McClure | A47C 15/004 | 297/188.03 |
| 7,735,939 B2 * | 6/2010 | Parshad | A47B 46/00 | 312/108 |
| 7,789,472 B2 * | 9/2010 | Richardson | A47F 3/004 | 312/265.3 |
| 7,942,485 B2 * | 5/2011 | Castelluccio | A47B 85/08 | 312/195 |
| 8,534,752 B2 * | 9/2013 | Martin | A47B 3/06 | 108/50.11 |
| 2005/0127802 A1 * | 6/2005 | Chen | A47B 57/36 | 312/265.4 |
| 2005/0173357 A1 * | 8/2005 | McClain | G06F 1/181 | 211/26 |
| 2007/0184723 A1 * | 8/2007 | Murphy | A47F 3/004 | 439/676 |
| 2007/0284974 A1 * | 12/2007 | Buhrman | A47B 47/042 | 312/108 |
| 2008/0074013 A1 * | 3/2008 | Ahlgrim | A47B 43/02 | 312/108 |
| 2009/0184612 A1 * | 7/2009 | McClure | A47B 61/00 | 312/235.9 |
| 2009/0267469 A1 * | 10/2009 | Stuit | A47B 61/00 | 312/271 |
| 2010/0176697 A1 * | 7/2010 | Fuerstenau | A47B 87/008 | 312/198 |
| 2010/0264791 A1 * | 10/2010 | Rajeswaran | A47B 83/00 | 312/237 |

\* cited by examiner

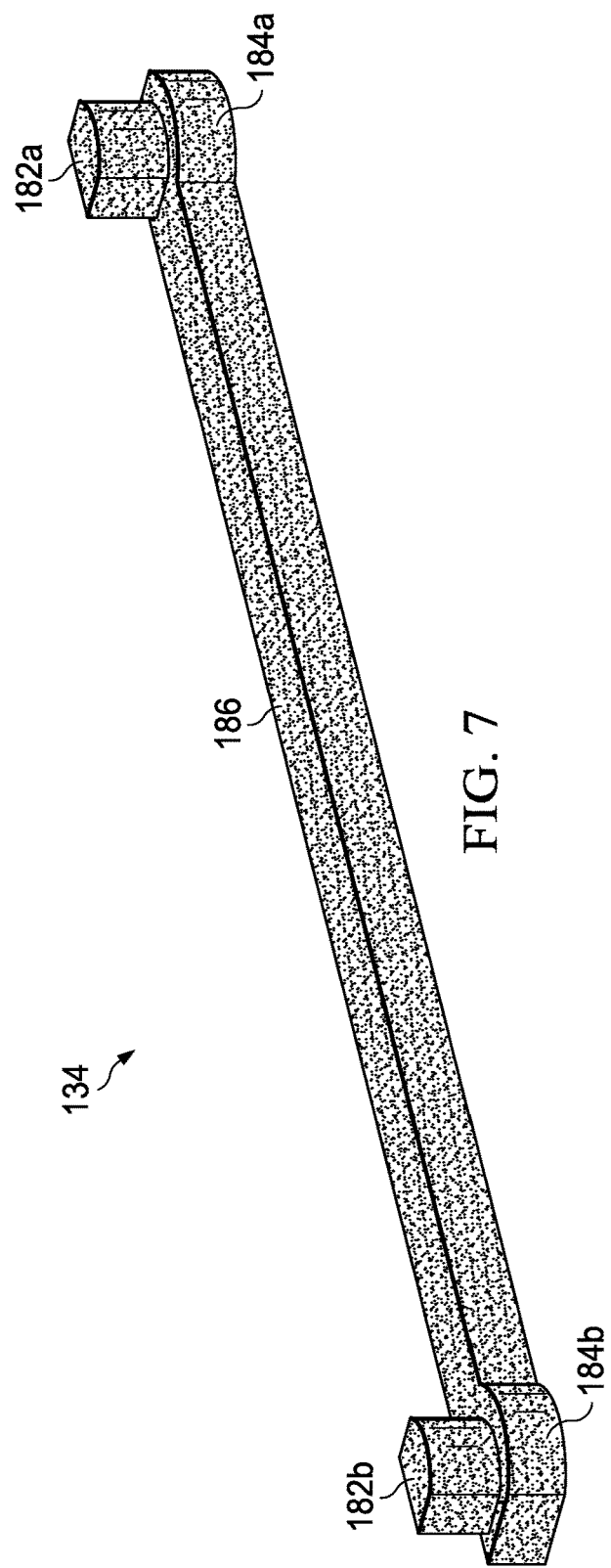

MODULAR SHELVING SYSTEMS AND METHODS

CROSS REFERENCE TO RELATED APPLICATIONS

The present application is a continuation of U.S. Nonprovisional patent application Ser. No. 14/993,992 filed on Jan. 12, 2016 and will issued as U.S. Pat. No. 9,814,310 on Nov. 14, 2017, and which is a continuation of U.S. Nonprovisional patent application Ser. No. 13/689,368 filed on Nov. 29, 2012 and issued as U.S. Pat. No. 9,237,803 on Jan. 19, 2016, and which claims the benefit under 35 U.S.C. § 119(e) of U.S. Provisional Patent Application Ser. No. 61/721,965 filed Nov. 2, 2012 and entitled "Modular Shelving Systems and Methods," and U.S. Provisional Patent Application Ser. No. 61/565,414 filed Nov. 30, 2011 and entitled "Modular Shelving Systems and Methods," all of which are incorporated herein by reference for all purposes.

FIELD OF THE INVENTION

The present disclosure relates generally to modular furniture and, in particular, to modular shelving systems and methods.

BACKGROUND

With the rapid evolution of media and technology in recent years, there has been a growing trend toward integrating media and technology into all aspects of educational study and work. Conventional shelving systems are generally not designed to accommodate and support media and technology, such as televisions, computers, laptops, terminals, flat panel monitors, or other electronic media. Moreover, conventional shelving systems typically have a fixed construction that inhibits adaptability to various uses, and such systems are generally standalone units that cannot readily pair with or couple to other shelving units or furniture.

SUMMARY

Embodiments of the present disclosure generally provide modular shelving systems comprising a plurality of components that may include, but is not limited to, a support frame and components thereof, a top panel, a side panel, a top shelf cap, a shelf, storage, a display support shelf, an exterior media mounting, an exterior media shelf, a shelf stop, a bracket, a shelf divider, and lighting.

Embodiments of the present disclosure further provide methods of assembling modular shelving system components into configuration assemblies for a variety of different uses, including, for example, storing objects; displaying items; organizing, supporting and displaying electronic media; providing a seating area; providing a work surface, such as a marker board; pairing with and coupling a configuration assembly to other shelving units and/or furniture, or any combination thereof.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIG. 7 is a perspective view of a representative top shelf cap of the system of modular shelving components according to embodiments of the present disclosure.

DETAILED DESCRIPTION

Figure 1:
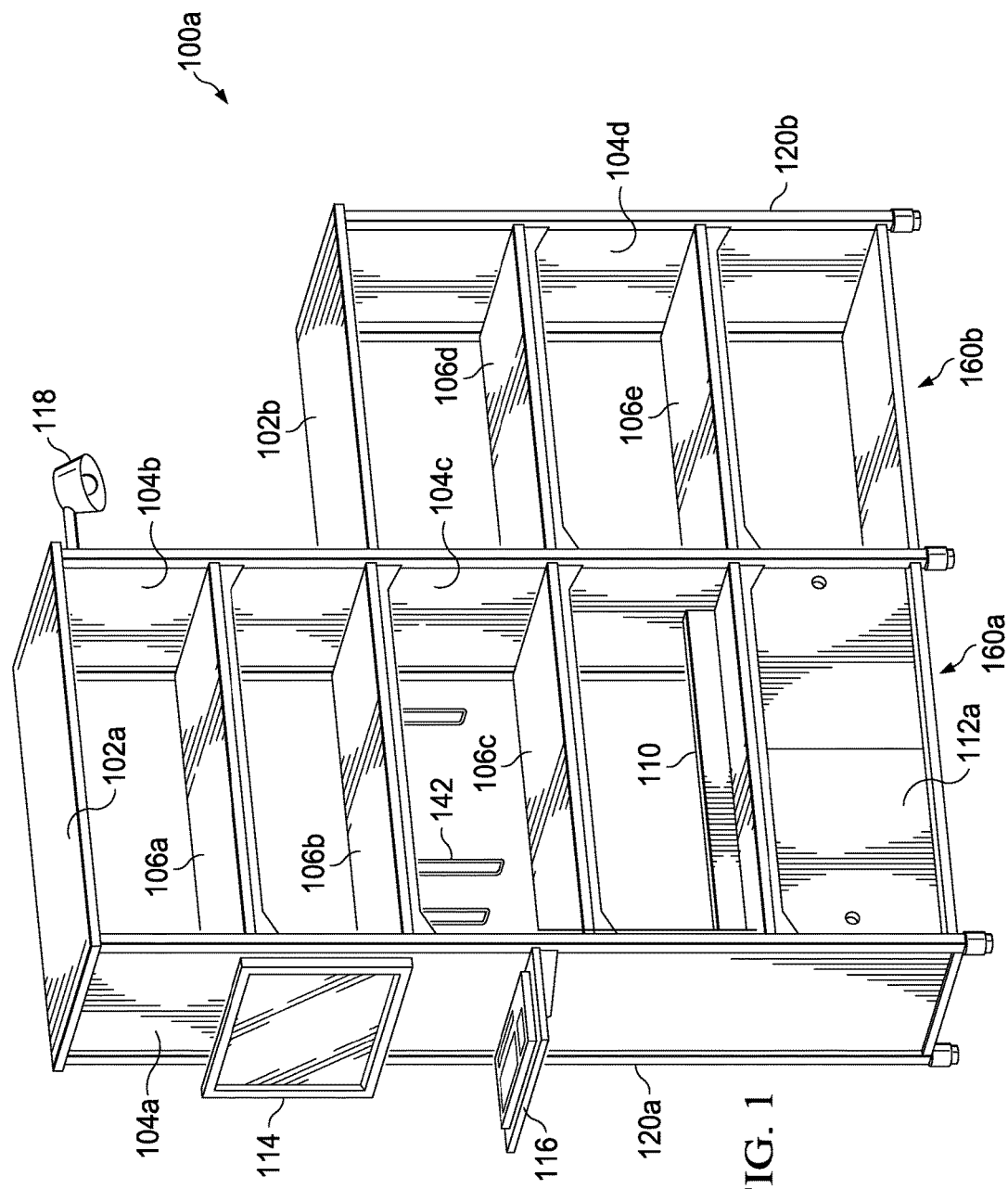
FIG. 1 is a perspective view of a system of modular shelving components arranged in a first representative configuration according to embodiments of the present disclosure.

Embodiments of the present disclosure generally provide a modular shelving system comprising a plurality of configurable components and methods of forming configuration assemblies from such components. In certain embodiments, the present disclosure may provide modular shelving systems configured for pairing with and coupling to other shelving units and/or furniture.

FIGS. 1-6 illustrate representative configurations 100a, 100b, 100c, 100d, 100e of a modular shelving system 100 and parts thereof. The modular shelving system 100 comprises a plurality of components assembled to form configurations 100a, 100b, 100c, 100d, 100e. It should be understood that the components of system 100 forming the configurations 100a, 100b, 100c, 100d, 100e and parts thereof shown in FIGS. 1-6 are for illustrative purposes only, and that any other suitable components or subcomponents may be used in conjunction with or in lieu of the components comprising system 100 and parts of system 100.

The components of modular shelving system 100 may generally comprise one or more of a top panel 102, a side panel 104, a shelf 106, a display support panel 108, a shelf stop 110, storage 112, a media mounting 114, an exterior media shelf 116, a lighting device 118, a frame member 120, other suitable components, or any combination thereof according to embodiments of the present disclosure. The components of modular shelving system 100 may be customized, reconfigured, or adjusted to provide a certain size, shape, configuration, position, purpose, utility, decorative look, other suitable disposition, or any combination thereof.

Configurations of modular shelving system 100 may be used as, for example, a bookshelf, a display shelf, a media display and organization space, an organization platform, a workspace, a writing surface, a storage space, a reading area, a sitting area, other suitable uses, or any combination thereof according to embodiments of the present disclosure.

In one embodiment, modular shelving system 100 may be employed to store and display books, magazines, documents, other printed material, records, compact discs, collectable paraphernalia, electronic media devices, personal items, other suitable objects, or any combination thereof. Components of system 100 may include one or more surfaces that are, for example, generally horizontal, semi-horizontal, inclined, tilted, two-tiered, multiple tiered, other suitably disposed, shaped, configured, or treated body, element, or surface, or any combination thereof.

In embodiments of the present disclosure, configurations of the modular shelving system 100 may generally house, retain, or otherwise support, for example, a television screen, liquid crystal display (LCD) screen, plasma screen, high definition television (HDTV) screen, projection television screen, computer screen, laptop, computer, central processing unit (CPU), monitor, terminal, video conferencing display, other suitable devices, connections, outlets, or areas, or any combination thereof.

Referring now to FIG. 1, a representative configuration 100a of components of modular shelving system 100 is illustrated. The configuration 100a generally comprises a first assembly of modular components 160a (herein referred to as assembly 160a) and a second assembly of modular components 160b (herein referred to as assembly 160b), according to embodiments of the present disclosure.

First assembly 160a may include top panel 102a, side panel 104a, side panel 104b, storage 112a, and shelves 106a, 106b, 106c, all coupled to a supporting frame 120a. Top panel 102a may have a finished, rounded or curved right end and a finished, rounded or curved left end. In embodiments of the present disclosure, storage 112 may be used to generally provide a full or partial enclosure. Storage 112 may include any suitable pocket, storage area, surface, platform, plane, shelf, drawer, compartment, accessory, electrical outlet, telecommunications-related outlet, Ethernet outlet, WAN outlet, satellite outlet, cable outlet, audio/visual outlet, wire management system, other suitable structures, connections, outlets, or areas, or any combination thereof. Storage 112 may further include a cover and locking mechanism to secure and lock an object in storage 112. Such a cover and locking mechanism may be any suitable size, shape, or configuration. In embodiments of the present disclosure, storage 112 may provide additional structural integrity to assembly 160a of system 100.

The assembly 160a may further include a media mounting 114 and an exterior media shelf 116 coupled to the exterior surface of side panel 104a. The media mounting 114 may include a wall bracket to provide structural support to a media device mounted to the side panel 104. Exterior media shelf 116 may generally retain, or otherwise support an alphanumeric keyboard, as shown in FIG. 1, or mouse, trackball, cursor direction keys, touch pad, voice recognition device, other suitable media input device, or any combination thereof. The assembly 160a may further include a lighting device 118 affixed to the exterior surface of side panel 104b.

Second assembly 160b may include top panel 102b, side panel 104c, side panel 104d, and shelf 106d, and shelf 106e, all coupled to a supporting frame 120b. Side panel 104c of assembly 160b is shown disposed adjacent to or engaging side panel 104b of assembly 160a. The assemblies 160a and 160b may or may not be coupled according to embodiments of the present disclosure. In an embodiment where assemblies 160a and 160b are coupled, top panel 102b may have a finished, rounded or curved end and a finished, customized end such that it flushly abuts assembly 160a to create a continuous look. Furthermore, where assemblies 160a and 160b are coupled, side panel 104c of assembly 160b may be eliminated, such that side panel 104b may be shared between coupled assemblies 160a, 160b. Likewise, portions of frame 120b at the coupling location may be eliminated, such that the corresponding portions of frame 120a may be shared between coupled assemblies 160a, 160b.

Figure 2:
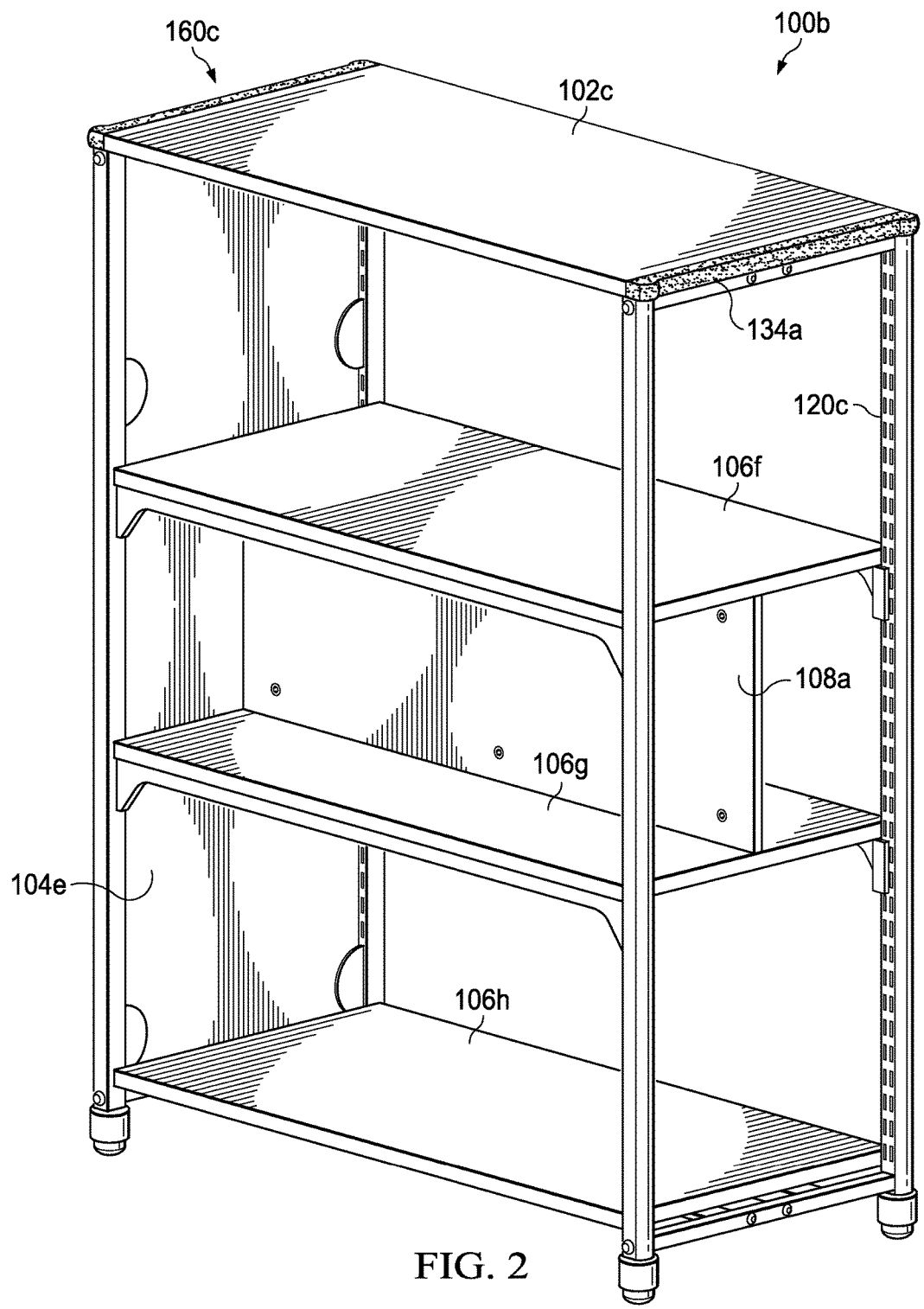
FIG. 2 is a perspective view of a system of modular shelving components arranged in a second representative configuration according to embodiments of the present disclosure.

FIG. 2 is a perspective view of another representative configuration 100b of components of modular shelving system 100 comprising an assembly of modular components 160c (herein referred to as assembly 160c), which may include top panel 102c, side panel 104e, shelves 106f, 106g, 106h, and a display support panel 108a, top shelf cap 134a, all coupled to a supporting frame 120c, according to embodiments of the present disclosure. In an embodiment, display support panel 108a may include brackets to receive and support a media device coupled to its surface.

In an embodiment, top shelf cap 134a may be employed at each end of a configuration containing one or more assemblies so that top panel 102c does not need to be finished, rounded or curved, custom cut, molded and sized to create a continuous look among assemblies.

Figure 3A:
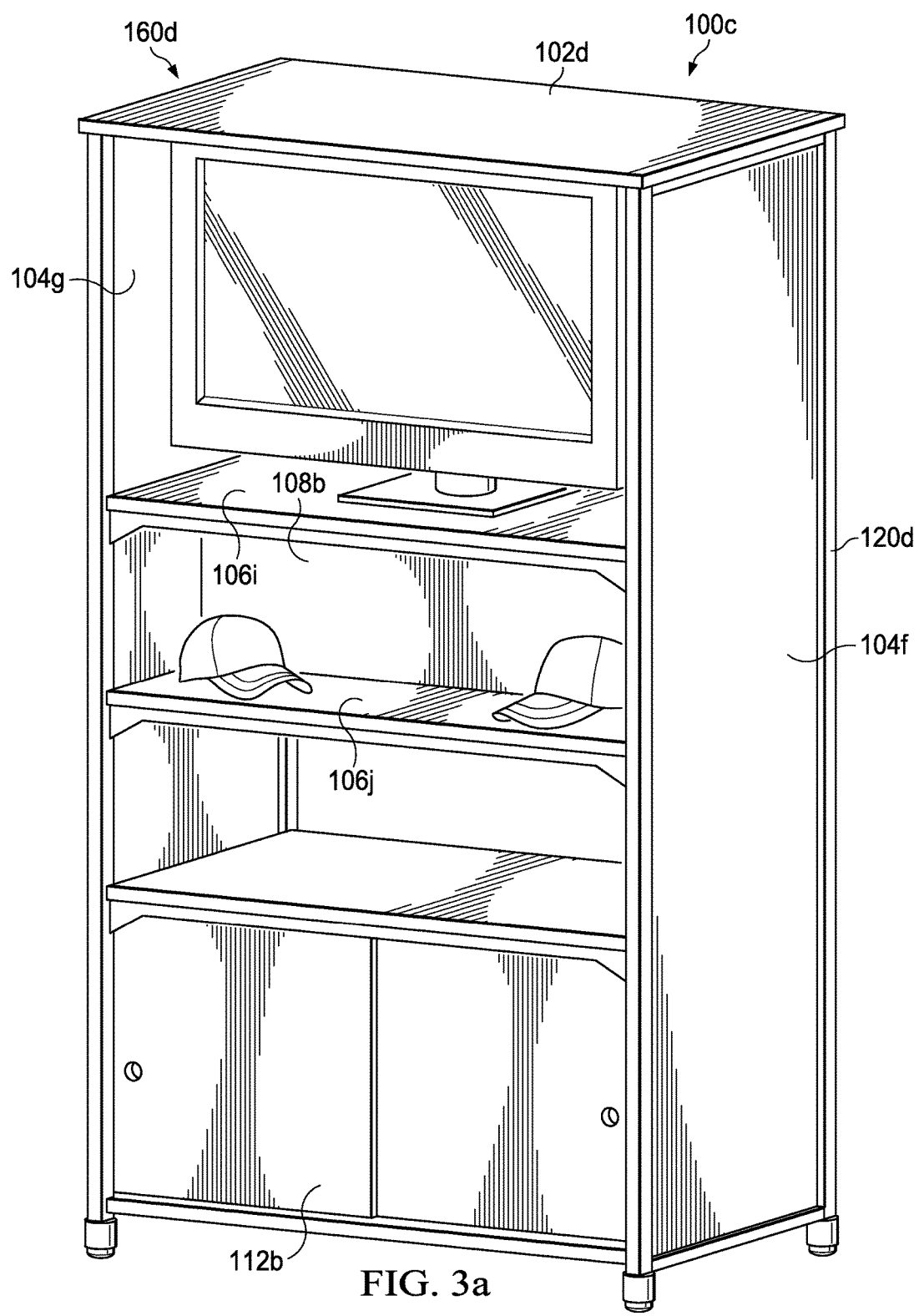
FIG. 3a is a perspective view of a system of modular shelving components arranged in a third representative configuration according to embodiments of the present disclosure.
Figure 3B:
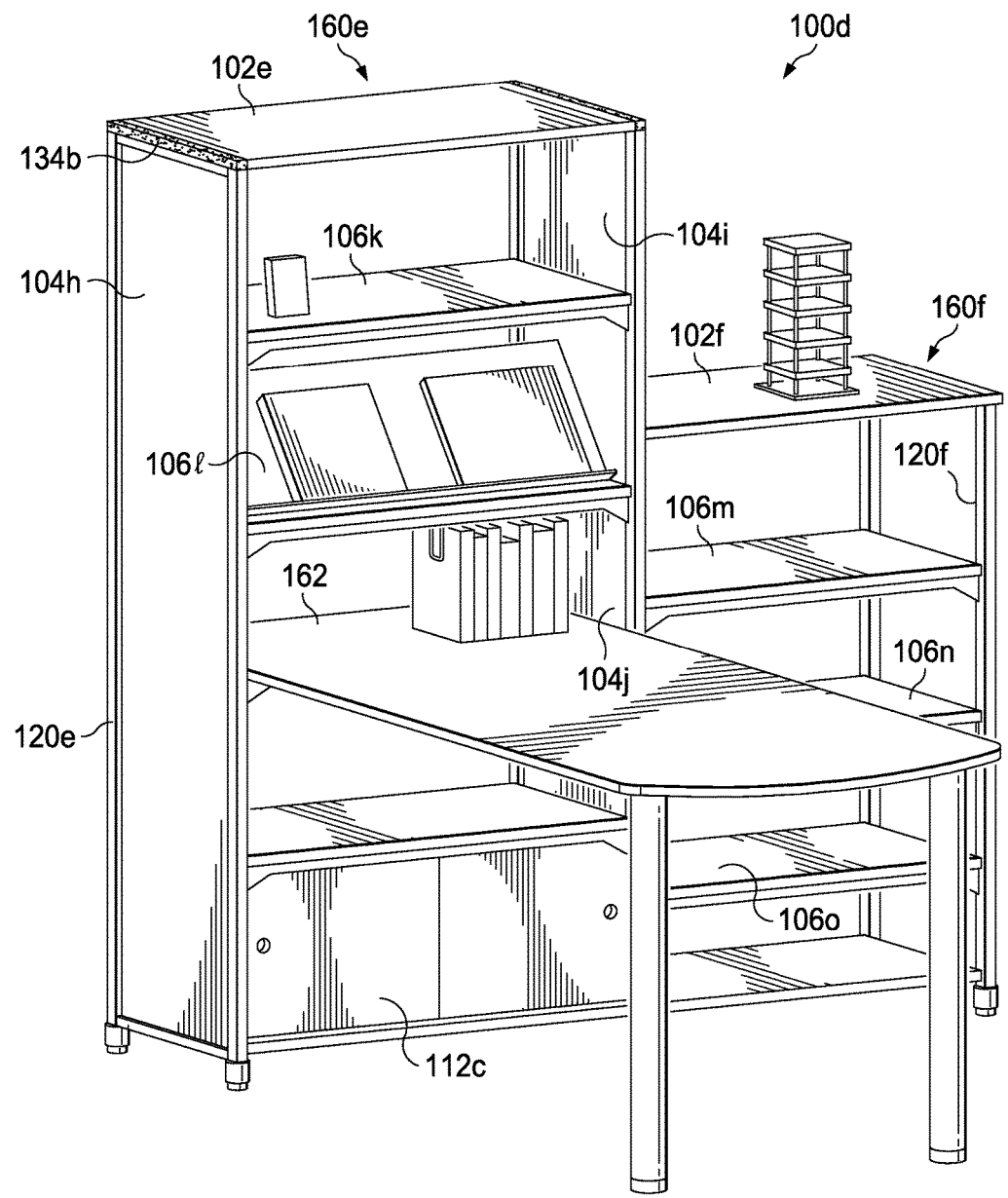
FIG. 3b is a perspective view of the system of modular shelving components arranged in a fourth representative configuration according to embodiments of the present disclosure.
Figure 3C:
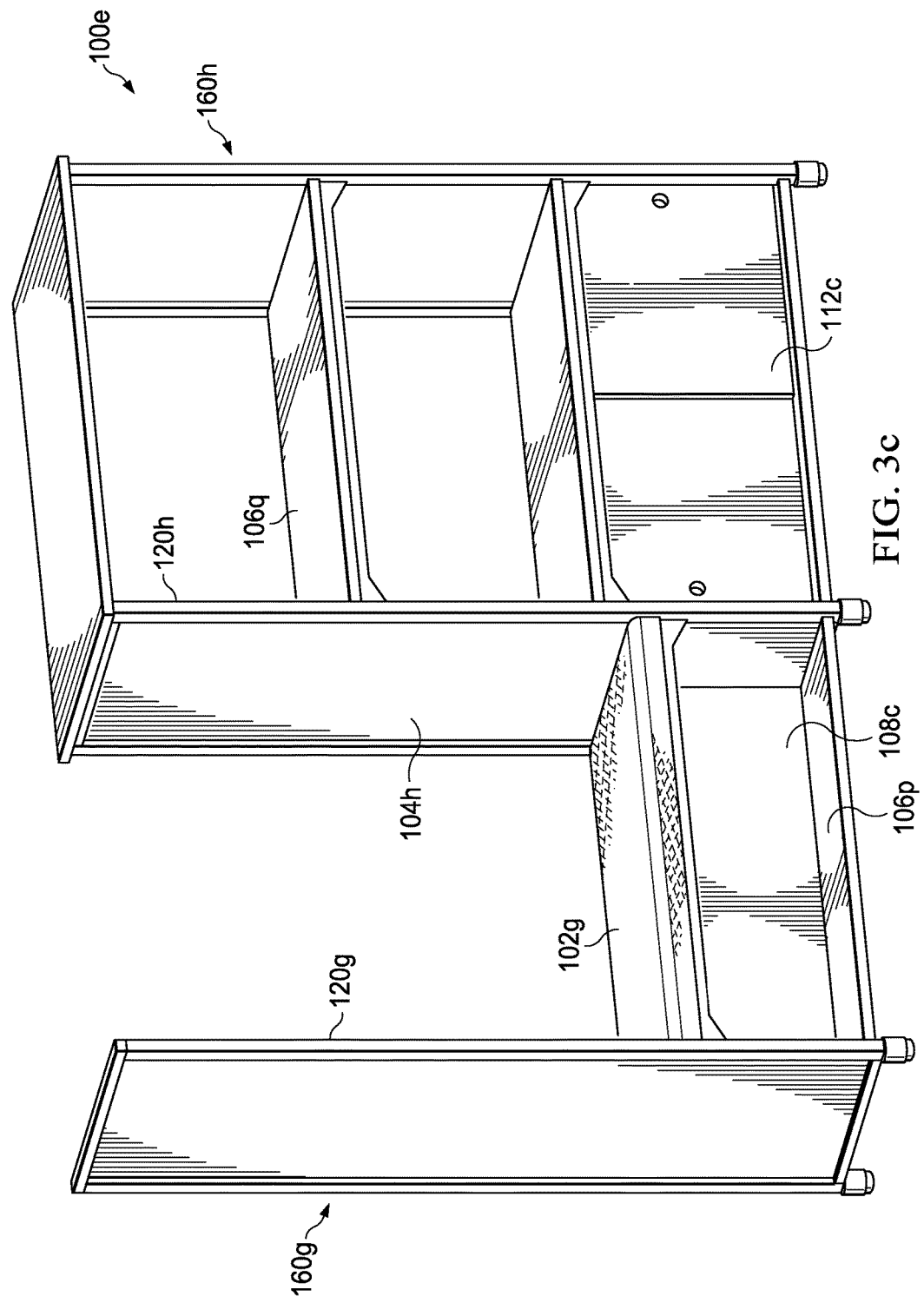
FIG. 3c is a perspective view of the system of modular shelving components arranged in a fifth representative configuration according to embodiments of the present disclosure.

FIGS. 3a, 3b, and 3c depict further representative configurations 100c, 100d, 100e of modular shelving system 100 integrating further components that demonstrate the flexibility and configurability of system 100.

FIG. 3a is a perspective view of representative configuration 100c of components of modular shelving system 100 comprising an assembly of modular components 160d (herein referred to as assembly 160d), which may include top panel 102d, side panel 104f, side panel 104g, shelf 106i, shelf 106j, display support panel 108b, and storage 112b, all coupled to a supporting frame 120d, according to embodiments of the present disclosure. Top panel 102d may have a finished, rounded or curved right end and a finished, rounded or curved left end. Shelf 106i may be employed to support and display electronic media devices, such as a television screen, as shown in FIG. 3a. In an embodiment, side panels 104f may be made of, composed of, coated with, layered with, or otherwise include materials to allow side panel 104f to be employed as a marker board, magnetic board, chalk board, tack board, sticker board, design board, other suitable uses, or any combination thereof.

FIG. 3b is a perspective view of representative configuration 100d of components of modular shelving system 100 comprising a third assembly of modular components 160*e* (herein referred to as assembly 160*e*) and a fourth assembly of modular components 160*f* (herein referred to as assembly 160*f*).

Third assembly 160*e* may include top panel 102*e*, side panel 104*h*, side panel 104*i*, top shelf cap 134*b*, shelf 106*k*, shelf 106*l*, and storage 112*c*, all coupled to a supporting frame 120*e*, according to embodiments of the present disclosure. In an embodiment, top shelf cap 134*b* may be employed at one end of a configuration containing one or more assemblies so that top panels 102*e* does not need to be finished, rounded or curved, custom cut, molded and sized to create a continuous look among assemblies. In another embodiment, as depicted in assembly 160*f*, top panel 102*f* may have a finished, rounded or curved end and a finished, customized end such that it flushly abuts assembly 160*e* to create a continuous look. In an embodiment, shelf 106*l* of assembly 160*e* may include one or more surfaces that are inclined or tilted so as to display books, magazines, documents, other printed material, records, compact discs, collectable paraphernalia, electronic media devices, personal items, other suitable objects, or any combination thereof. The assembly 160*e* may further provide support for a table or desk 162 as shown extending perpendicularly from the frame 120*e*, according to one embodiment of the present disclosure. In an embodiment, the desk 162 is paired with and coupled to the frame 120*e*.

Fourth assembly 160*f* may include top panel 102*f*, side panel 104*j*, shelf 106*m*, shelf 106*n* and shelf 106*o*, all coupled to a supporting frame 120*f*. Side panel 104*j* of assembly 160*f* is shown disposed adjacent to or engaging side panel 104*i* of assembly 160*e*. The assemblies 160*e* and 160*f* may or may not be coupled according to embodiments of the present disclosure. In an embodiment where assemblies 160*e* and 160*f* are coupled, side panel 104*j* of assembly 160*f* may be eliminated, such that side panel 104*i* may be shared between coupled assemblies 160*e*, 160*f*. Likewise, portions of frame 120*f* at the coupling location may be eliminated, such that the corresponding portions of frame 120*e* may be shared between coupled assemblies 160*e*, 160*f*.

FIG. 3*c* is a perspective view of representative configuration 100*e* of components of modular shelving system 100 comprising a fifth assembly of modular components 160*g* (herein referred to as assembly 160*g*) and a sixth assembly of modular components 160*h* (herein referred to as assembly 160*h*).

Fifth assembly 160*g* may include a top panel 102*g*, a side panel 104*g*, a display support panel 108*c*, and a shelf 106*p*, all coupled to a supporting frame 120*g*. In an embodiment, top panel 102*g* may be made of, composed of, coated with, layered with, or otherwise include cushioning or other suitable materials to allow top panel 102*g* to be employed as a cushion, seating area, reclining area, step stool, other suitable uses, or any combination thereof.

FIG. 3*c* depicts assembly 160*g* disposed adjacent to partially illustrated sixth assembly 160*h* comprising a shelf 106*q* and storage 112*e* coupled to a supporting frame 120*h*. The assemblies 160*g* and 160*h* may or may not be coupled according to embodiments of the present disclosure. In an embodiment where assemblies 160*g* and 160*h* are coupled, side panel 104*g* of assembly 160*g* may be shared between coupled assemblies 160*g*, 160*h*. Likewise, portions of frame 120*h* at the coupling location may be eliminated, such that the corresponding portions of frame 120*g* may be shared between coupled assemblies 160*g*, 160*h*.

Figure 4A:
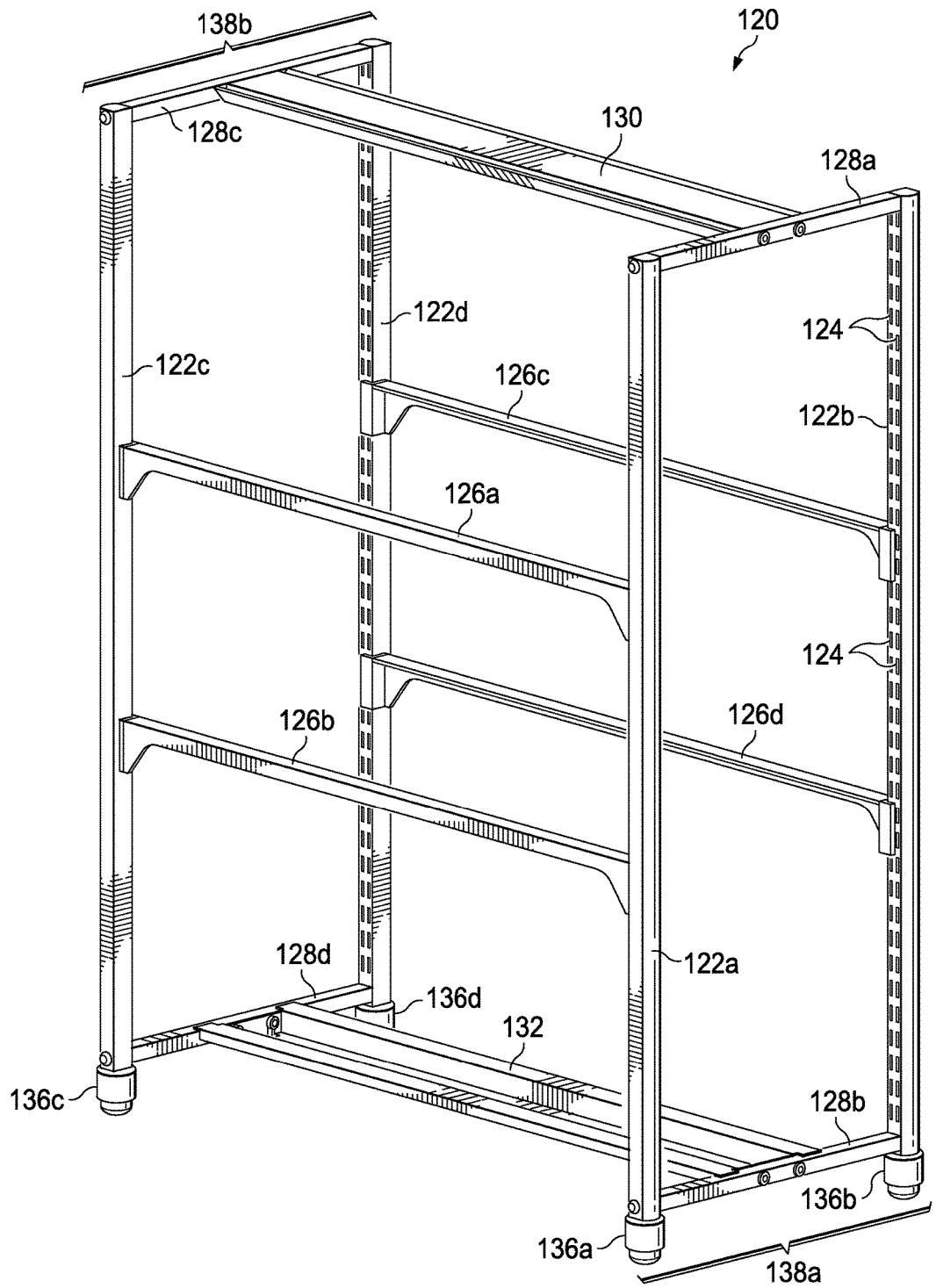
FIG. 4a is a perspective view of a representative support frame of the system of modular shelving components according to embodiments of the present disclosure.
Figure 4B:
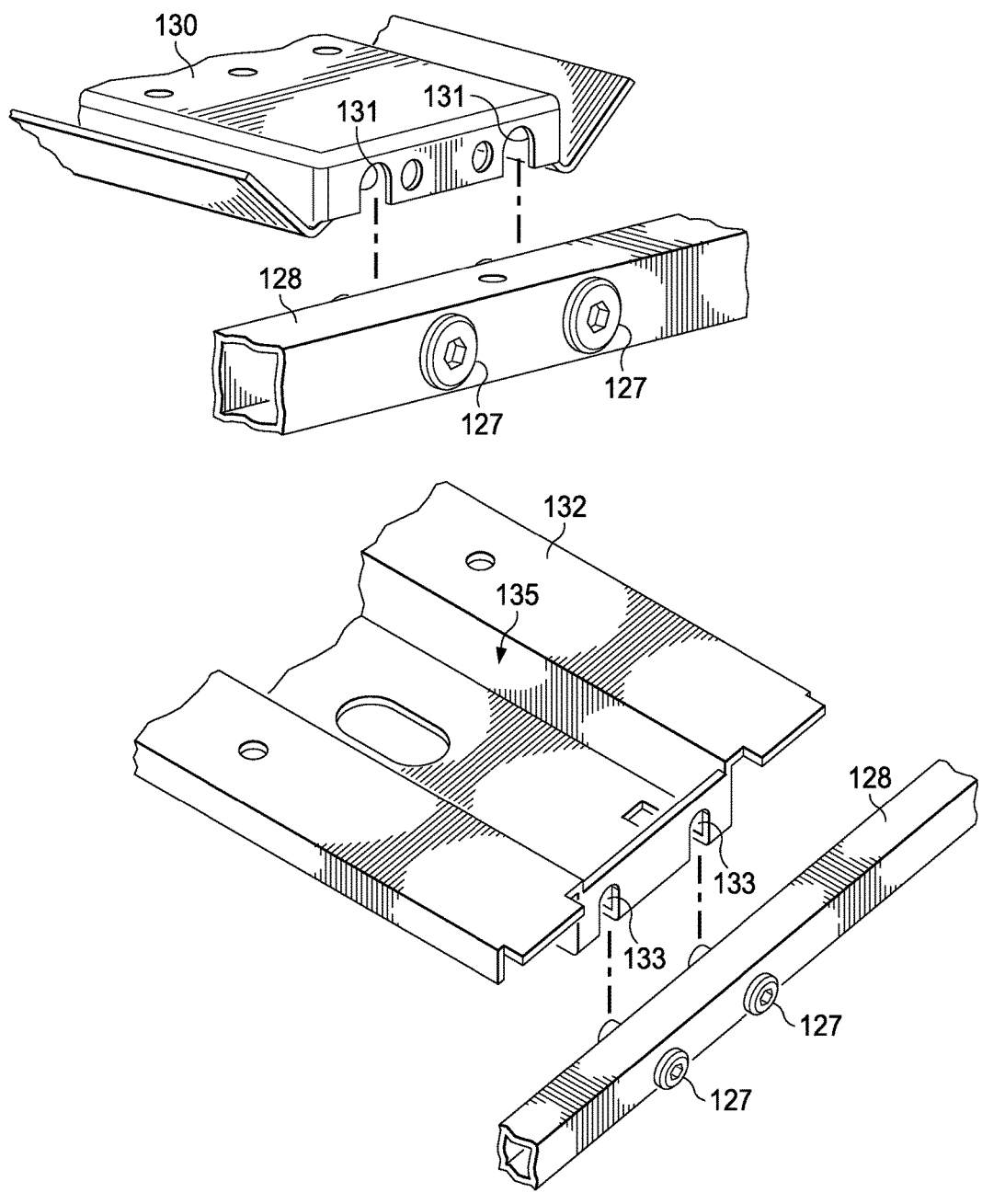
FIG. 4b provides exploded views of a top channel connection to a leg connector of the frame shown in FIG. 4a and a bottom channel connection to a leg connector of the frame shown in FIG. 4a, respectively, according to embodiments of the present disclosure.
Figure 4C:
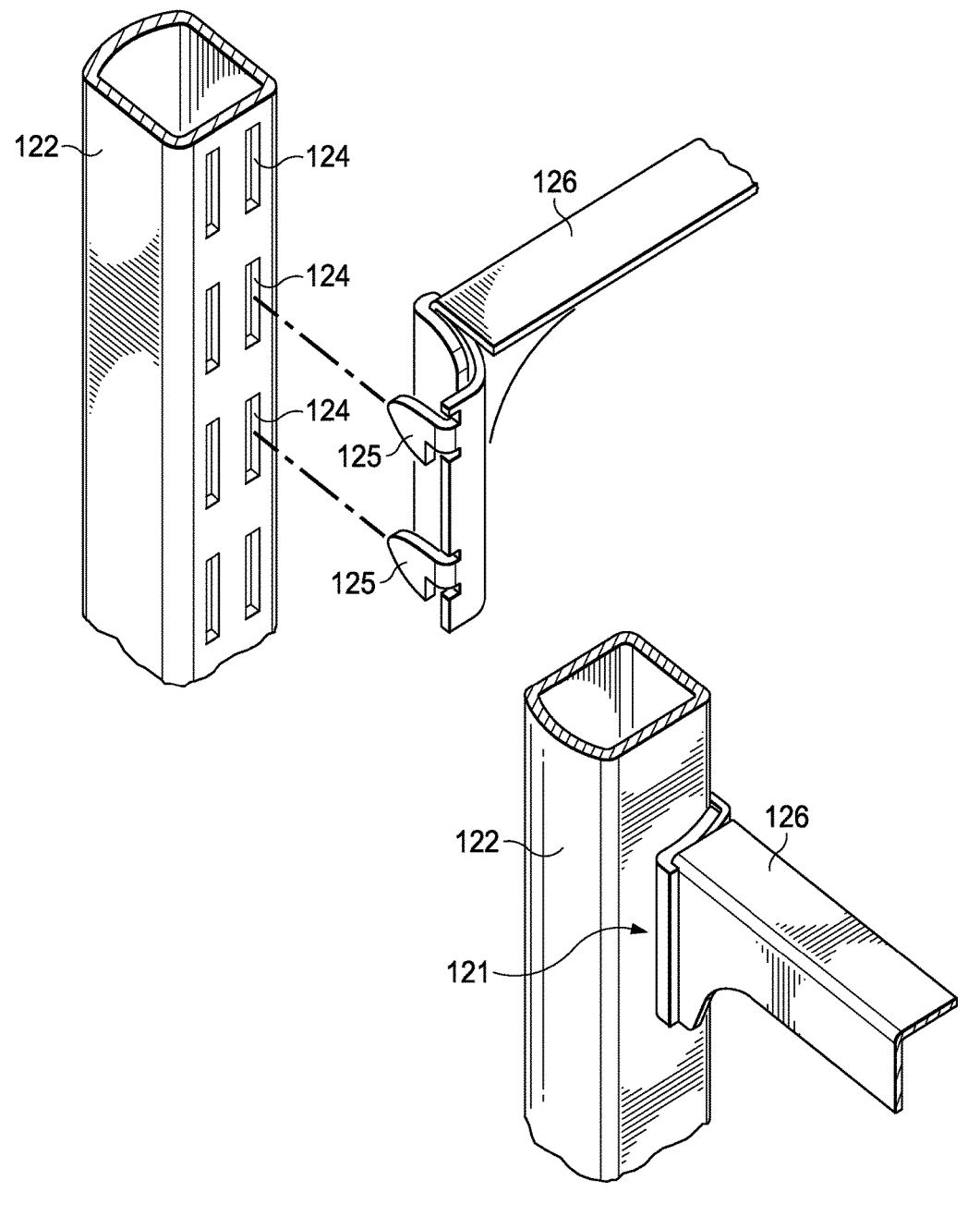
FIG. 4c is an exploded view of a shelf support connection to a leg of the frame shown in FIG. 4a according to embodiments of the present disclosure.

FIG. 4*a* generally illustrates a representative supportive frame member 120 that may be employed in the configurations 100*a*, 100*b*, 100*c*, 100*d*, 100*e* of FIGS. 1-3 and other suitable configurations according to embodiments of the present disclosure. FIG. 4*b* provides exploded views of a top channel 130 connection to a leg connector 128 of the frame of FIG. 4*a*, and a bottom channel 132 connection to a leg connector 128 of the frame 120 of FIG. 4*a*, respectively. FIG. 4*c* is an exploded view of a shelf support 126 connection to a leg 122 of the frame 120 of FIG. 4*a*.

In more detail, frame member 120 may include legs 122*a*, 122*b*, 122*c*, and 122*d* (collectively referred to herein as legs 122); shelf supports 126*a*, 126*b*, 126*c*, and 126*d* (collectively referred to herein as shelf supports 126); leg connectors 128*a*, 128*b*, 128*c*, and 128*d* (collectively referred to herein as leg connectors 128); top channel 130; bottom channel 132; and leg caps 136*a*, 136*b*, 136*c*, and 136*d* (collectively referred to herein as leg caps 136), as generally depicted in FIG. 4*a*. Optionally, frame member 120 may include a spacer 121 as depicted in FIG. 4*c*.

In an embodiment, the legs 122 and the leg connectors 128 form side shells 138*a* and 138*b* (collectively referred to herein as side shells 138). In particular, leg 122*a* may be connected or otherwise coupled to leg 122*b* via leg connectors 128*a* and 128*b* to form side shell 138*a*, and leg 122*c* may be connected or otherwise coupled to leg 122*d* via leg connectors 128*c* and 128*d* to form side shell 138. Side shell 138*a* may be connected or otherwise coupled to side shell 138*b* through top channel 130, bottom channel 132, and shelf supports 126.

Legs 122 may be connected or otherwise coupled to leg connectors 128, side shells 138 may be connected or otherwise coupled to top channel 130 and bottom channel 132, and side shells 132 may be connected or otherwise coupled to shelf supports 126 in any suitable manner, such as, for example via male and female coupling adapters, which may include bolts 127 engaging sockets 131, 133 as shown in FIG. 4*b*, or tabs 125 engaging slots 124 as shown in FIG. 4*c*. Such connections or couplings may be achieved in other suitable manners including a screw and socket attachment, a clip or pin attachment, a ball and socket attachment, or other suitable connection or coupling mechanisms, or any combination thereof.

Leg caps 136 may be stationary stands or may include locking roller devices to allow configurations of system 100 to be easily orientated and positioned, as desired, and locked in place to prevent further movement.

Bottom channel 132 may include any suitably shaped, sized, or configured area 135 used to store, route, secure, or otherwise organize wires, cables, and other electronic devices according to embodiments of the present disclosure. In embodiments of the present disclosure, bottom channel 132 may be used to organize wire or cables associated with a laptop, computer, central processing unit (CPU), monitor, terminal, television, electronic display, external drive, storage device, computer accessory, lighting system, circuit breaker, electrical outlet, telecommunications-related outlet, Ethernet outlet, wide area network (WAN) outlet, satellite outlet, cable outlet, audio/visual outlet, wire management system, other suitable devices, objects, connections, outlets, or areas, or any combination thereof.

Figure 5A:
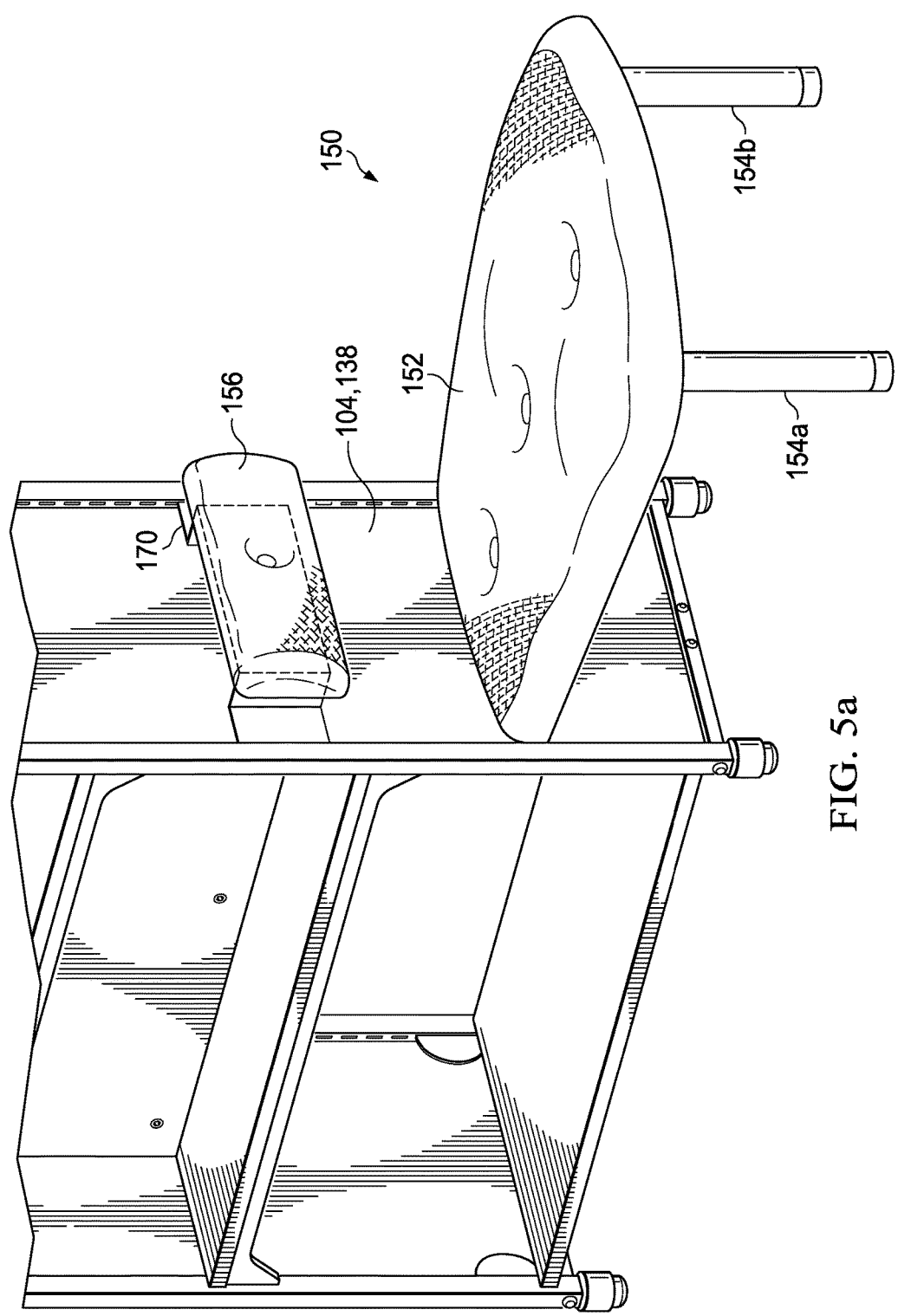
FIG. 5a is a perspective view of a representative side panel assembly according to embodiments of the present disclosure.

FIG. 5*a* generally depicts a representative side panel assembly 150 that may be coupled to side panel 104, side shell 138, other suitable object, or any combination thereof. Side panel assembly 150 may be employed in the configurations 100*a*, 100*b*, 100*c*, 100*d*, 100*e* of FIGS. 1-3 and other suitable configurations according to embodiments of the present disclosure.

Side panel assembly 150 may include bench 152 extending perpendicularly from the side panel 104 and resting on supporting legs 154a and 154b (collectively referred to herein as supporting legs 154), and plate 156 coupled side panel 104 through side support panel 170.

In an embodiment, bench 152 may be made of, composed of, coated with, layered with, or otherwise include cushioning or other suitable materials to allow bench 152 to be employed as a bench, cushion, chair, other seating area, lounging area, sleeping area, reclining area, stool, other suitable uses, or any combination thereof.

In alternative embodiments, bench 152 may be made of, composed of, coated with, layered with, or otherwise comprise a hard surface to allow bench 152 to be employed as a desk, writing area, workspace, reading area, display area, other suitable uses, or any combination thereof. In such an embodiment, bench 152 may also be employed to support and organize books, magazines, documents, other printed material, records, compact discs, collectable paraphernalia, electronic media devices, personal items, as well as to accommodate and support media and technology, such as televisions, computers, laptops, terminals, flat panel monitors, or other electronic media, other suitable items, or any combination thereof.

In an embodiment, plate 156 may be made of, composed of, coated with, layered with, or otherwise include cushioning or other suitable materials to allow plate 156 to be employed as a head rest, pillow, cushion, other suitable uses, or any combination thereof.

In alternative embodiments, plate 156 may be replaced with or used in conjunction with a shelf, artwork, display case, photo frame, television screen, liquid crystal display (LCD) screen, plasma screen, high definition television (HDTV) screen, projection television screen, computer screen, laptop, computer, central processing unit (CPU), monitor, terminal, video conferencing display, radio, other suitable devices, or any combination thereof.

In an embodiment, supporting legs 154 could comprise extendible leg assembly systems.

Figure 5B:
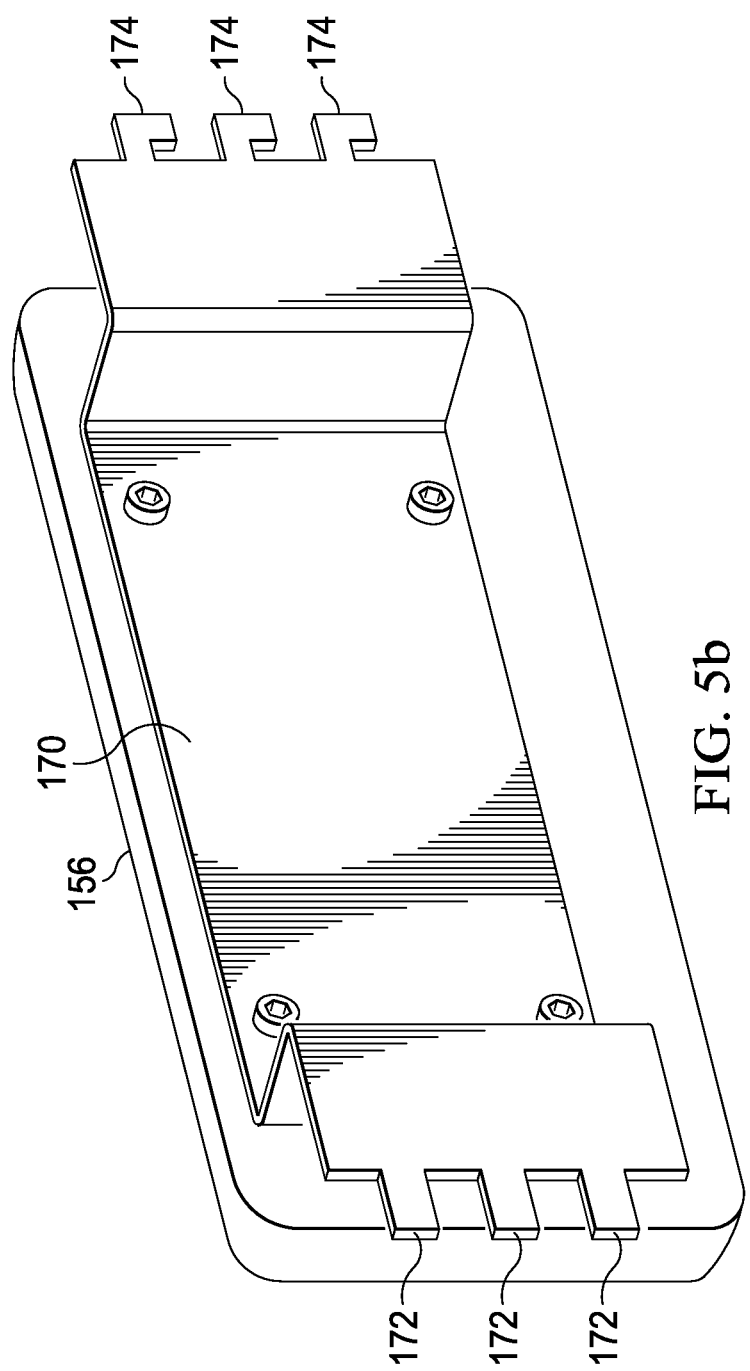
FIG. 5b is a interior view of a side support panel according to embodiments of the present disclosure.

FIG. 5b illustrates a posterior view of the side support panel 170 of the side panel assembly 150 of FIG. 5a. Side support panel 170 may include engaging surface 172 which is paired with or otherwise coupled to plate 156, side support panel tabs 172 and side support panel hooks 174.

Figure 5C:
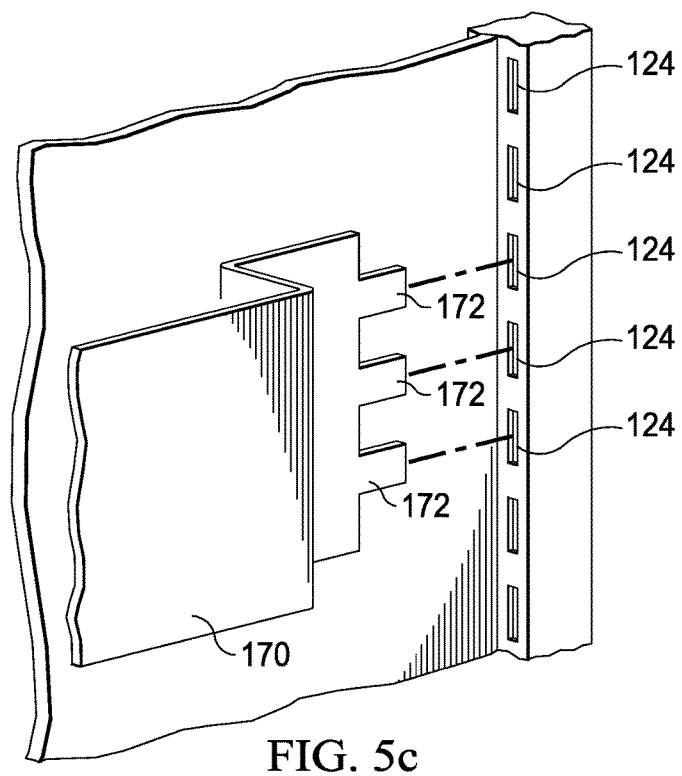
FIG. 5c is an exploded view of a side support panel tab connection to a leg of a support frame of the system of modular shelving components according to embodiments of the present disclosure.
Figure 5D:
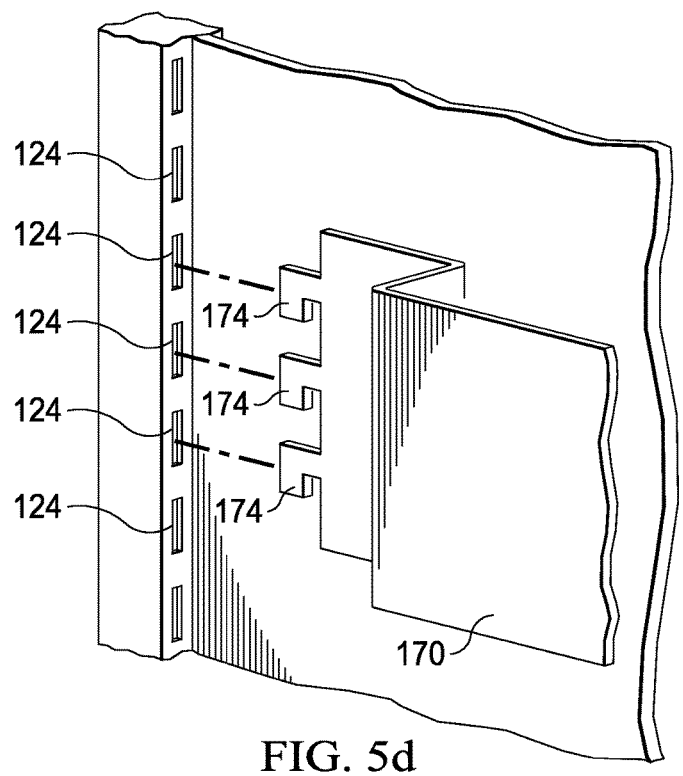
FIG. 5d is an exploded view of a side support panel hook connection to a leg of a support frame of the system of modular shelving components according to embodiments of the present disclosure.

FIG. 5c is an exploded view of a side support panel tab connection to a leg of a support frame of the system of modular shelving components according to embodiments of the present disclosure. FIG. 5d is an exploded view of a side support panel hook connection to a leg of a support frame of the system of modular shelving components according to embodiments of the present disclosure.

Side support panel 170 may be connected or otherwise coupled to side panel 104, side shell 138 in any suitable manner, such as, for example via male and female coupling adapters, which may include side support panel tabs 172 engaging slots 124 as shown in FIG. 5c, or side support panel hooks 174 engaging slots 124 as shown in FIG. 5d. Such connections or couplings may be achieved in other suitable manners including a screw and socket attachment, a clip or pin attachment, a ball and socket attachment, or other suitable connection or coupling mechanisms, or any combination thereof.

In an embodiment, bench 152 and side support panel 170 may be connected or otherwise coupled to side panel 104, side shell 138, other suitable object, or any combination thereof at any height, as desired.

Figure 6:
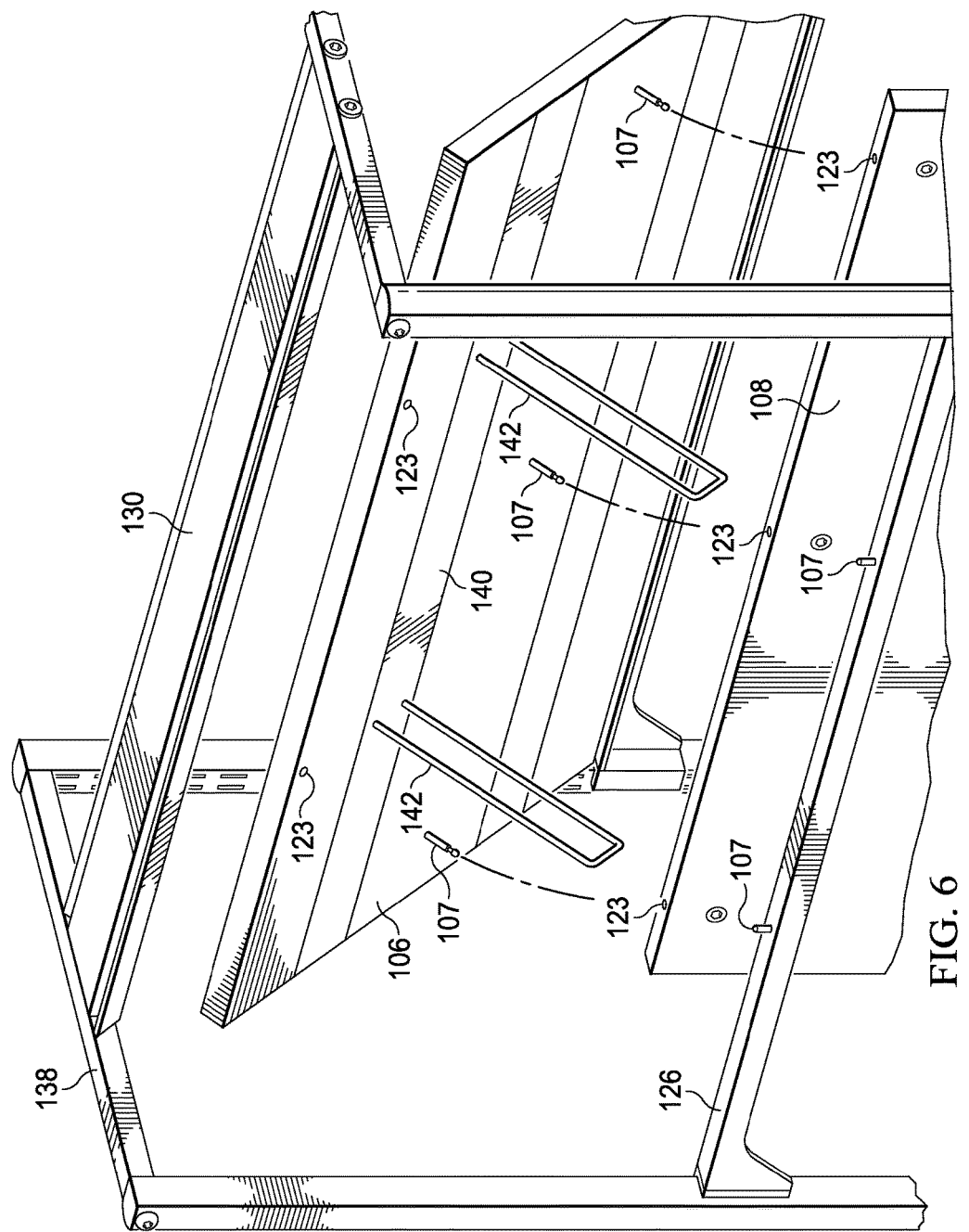
FIG. 6 is an exploded view of a shelf connecting or coupling to a shelf support according to embodiments of the present disclosure.

FIG. 6 is an exploded view showing a representative shelf 106 connecting or otherwise coupling to a shelf support 126 and/or a display support panel 108 according to one embodiment of the present disclosure. Shelf 106 may connect or otherwise couple to shelf support 126 and/or display support panel 108 in any manner, such as, for example via male and female coupling adapters, which may include pins 107 on shelf 106 engaging holes 123 on display support panel 108 and pins 107 on shelf support 126 engaging holes 123 on shelf 106 as shown in FIG. 6. Such connections or couplings may be achieved by other suitable manners, including a bolt and socket attachment, a screw and socket attachment, a ball and socket attachment, other suitable connecting or coupling mechanisms, or any combination thereof.

In an embodiment, the lower surfaces of top panel 102 or shelves 106 may include a channel 140 supporting elongated brackets 142 extending perpendicularly from the channel 140 as shown in FIG. 1 and FIG. 6. Brackets 142 may be employed as book end type devices to support and organize books, magazines, documents, other printed material, records, compact discs, collectable paraphernalia, electronic media devices, personal items, other suitable objects, or any combination thereof.

FIG. 7 generally illustrates a representative top shelf cap 134 that may be employed in the modular shelving system 100 as depicted in configurations 100b and 100d of FIGS. 2 and 3b, and other suitable configurations according to embodiments of the present disclosure.

In more detail, top shelf cap 134 may include leg anchors 182a and 182b (collectively referred to herein as leg anchors 182); curved finished end moldings 184a and 184b (collectively referred to herein as moldings 184); and finished edge 186 as generally depicted in FIG. 7.

In an embodiment, leg anchors 182 may be inserted into the top openings of legs 122, such that the moldings 184 are disposed along the exterior surface of the upper most portion of legs 122 and finished edge 186 is flush against top leg connector 128. Such connections or couplings between top shelf cap 134 and side shell 138 may be achieved in other suitable manners including a screw and socket attachment, a clip or pin attachment, a ball and socket attachment, or other suitable connection or coupling mechanisms, or any combination thereof.

Two or more configuration assemblies of systems 100 may be oriented next to each other to create a continuous shelving look among the plurality of assemblies. Top shelf caps 134 may be affixed and locked onto side shell 138 on each end of the plurality of assemblies to create a finished look, without having to custom cut, mold and size each top panel 102. Thus, when two or more configuration assemblies of systems 100 are oriented next to each other, the top panels 102 of each assembly may be uniformly cut to the same size and unfinished ends since the top shelf caps 134 provide finished ends.

In embodiments of the present disclosure, optional braces may be affixed to top panel 102, side panels 104, shelves 106, display support panel 108, and storage 112, or parts of top panel 102, side panels 104, shelves 106, display support panel 108, storage 112 and/or side support panel 170 to provide additional support for connections between such elements, as well as to provide a finished look.

In embodiments of the present disclosure, top panel 102, side panels 104, shelves 106, display support panel 108, and storage 112, or parts of top panel 102, side panels 104, shelves 106, display support panel 108, storage 112 and/or side support panel 170 may be made of, composed of, coated with, layered with, or otherwise include, for example, laminate, veneer, wood, cork, medium density fiber (MDF) board, particle board, melamine, granite, solid surface, tile, ceramic tile, fiberglass, soap stone, engineering stone, marble, concrete, slate, wood, butcher block, glass, steel, stainless steel, aluminum, metal, mesh, apertured material, plastic, blackboard material, wipe-off board material, mirror, paint, lacquer, polypropylene, polyurethane, polyethylene, polyvinyl chloride (PVC), silicon, polytetrafluoroethylene (PTFE), polyester, high-gloss polyester, synthetic rubber, natural rubber, polymer, fabric, natural fiber, synthetic fiber, other suitable materials, or any combination thereof.

Legs 122, shelf supports 126, leg connectors 128 top channel 130, bottom channel 132, side shells 138, and/or side support panel 170 may be made of, composed of, coated with, layered with, or otherwise include, for example, steel, aluminum, brass, bronze, stainless steel, another type of metal, wood, nylon, plastic, polyurethane, polyethylene, polyvinyl chloride (PVC), polytetrafluoroethylene (PTFE), polyester, high-gloss polyester, laminate, plexiglass, polymer, other suitable materials, or any combination thereof.

Top shelf caps 134 and leg caps 136 may be suitably shaped, sized, or configured. In addition, top shelf caps 134 and leg caps 136 may be made of synthetic rubber, natural rubber, plastic, wood, polyester, high-gloss polyester, laminate, plexiglass, polymer, metal, steel, aluminum, brass, bronze, nylon, other suitable materials, or any combination thereof.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A modular shelving system comprising:
   a first linkable shelving assembly comprising:
      a frame, comprising:
         four or more first legs, and wherein each first leg comprises:
            a first end;
            a second opposing end disposed more proximate a ground on which the first linkable shelving assembly is disposed than the first end; and
            a plurality of first slots disposed between the first end and the second end, and wherein the plurality of first slots are disposed in a first column of slots and a second column of slots;
      a top panel disposed proximate the first end of at least two of the first legs; and
      at least one side panel, wherein the at least one side panel comprises a first side panel, wherein the first side panel is coupled to one or more slots of at least two of the legs, wherein the first side panel includes an inner surface and an outer surface, and wherein the first side panel encloses the first linkable shelving assembly on a first side; and
      at least one shelf extending between the four or more legs, wherein the at least one shelf extends along a first axis relative to the frame, and wherein the at least one shelf is coupled to at least one of the slots in the first column of slots in at least four of the legs; and
      at least one of a bench or a desk extending along the first axis, wherein the at least one of the bench or the desk is coupled to one or more of the slots in the second column of slots of at least two of the legs.

2. The modular shelving system of claim 1, wherein the first linked shelving assembly comprises at least one additional shelf coupled to the frame below the top panel.

3. The modular shelving system of claim 2, wherein one or more of the shelves comprises at least one of: a horizontal shelf, a semi-horizontal shelf, an inclined shelf, a tilted shelf, a two tiered shelf, a multiple tiered shelf, a display shelf, a bookshelf, an electronic media display support platform, an electronic media organization shelf, a desk or a table.

4. The modular shelving system of claim 1, wherein the at least one side panel further comprises a second side panel coupled to the frame on an opposing second side opposite the first side, the second side panel having an inner surface and an outer surface, wherein the inner surface of the second side panel encloses the second side of the first linkable shelving assembly.

5. The modular shelving system of claim 1, wherein the frame of the first linked shelving assembly further comprises a wire management system configured to receive at least one of wires, cables, or other electronic accessories from an electronic media device supported by the first linkable shelving assembly.

6. The modular shelving system of claim 1, wherein the at least one of a bench or a desk comprises a bench, and wherein the first end of the bench includes at least one fastening mechanism to join the bench to the frame of the first linked shelving assembly such that the first end of the seating platform is proximate the outer surface of the first side panel of the first linked shelving assembly.

7. The modular shelving system of claim 6, wherein the at least one fastening mechanism comprises at least one of: a hook and eye fastener, a tab and slot fastener, a pin and clip attachment, a screw and socket attachment, a ball and socket attachment, or male and female coupling adapters.

8. The modular shelving system of claim 1, wherein the bench includes at least one leg to provide at least a portion of the structural support to the bench, and wherein the desk comprises at least one leg to provide at least a portion of the structural support to the desk.

9. The modular shelving system of claim 6, further comprising a head rest disposed above the bench, and wherein the head rest comprises at least one fastening mechanism to join the head rest to the frame of the first linked shelving assembly such that the head rest is proximate the outer surface of the first side panel of the first linked shelving assembly.

10. The modular shelving system of claim 1, further comprising one or more additional linkable shelving assemblies, wherein each additional linkable shelving comprises:
a frame comprising:
two or more second legs, and wherein each second leg comprises:
a first end;
a second opposing end disposed more proximate a ground on which additional linkable shelving assembly is disposed than the first end; and
a plurality of first slots disposed between the first end and the second end, and wherein the plurality of first slots are disposed in a first column of slots and a second column of slots;
at least one second shelf extending along the first axis relative, and wherein the at least one second shelf is coupled to at least one of the slots in the first column of slots in at least two of the second legs.

11. The modular shelving system of claim 10, wherein the top panel of the first linked shelving assembly includes a first end and a second end, the first end and the second end customized to flushly abut a frame of the adjacent one of the additional linkable shelving assembly to create a continuous look.

12. The modular shelving system of claim 10, wherein the first linkable shelving assembly and one of the additional shelving assemblies are disposed adjacent each other, and wherein the first side panel is disposed between the first linked shelving assembly and the one of the additional shelving assemblies such that an inner surface of the one of the first side panels encloses the first linkable shelving assembly on a first side and the outer surface encloses at least a portion of the one of the additional linkable shelving assemblies on one side.

13. The modular shelving system of claim 1, wherein the outer surface of the at least one side panel includes a bracket configured to support and secure an electronic media device against the outer surface.

14. The modular shelving system of claim 1, wherein the at least one of the bench or the desk is coupled to at least two of the legs on the first side of the first linkable shelving assembly; and wherein the first linkable shelving assembly comprises a second side opposite to the first side; and further comprising at least one of additional bench or additional desk coupled to at least two of the legs on the second side of the first linkable shelving assembly.

15. The modular shelving system of claim 1 further comprising at least one exterior media shelf coupled to the frame, wherein the at least one exterior media shelf is proximate an outer surface of the first panel.

16. The modular shelving system of claim 1 further comprising one or more elongated brackets extending from one or more channels, wherein the one or more channels are disposed in at least one of a lower surface of the top panel or a lower surface of at least one of the shelves.

17. A modular shelving system comprising:
more than one linkable shelving assembly, wherein each linkable shelving assembly comprises:
a first side;
a second opposing side;
a third side disposed between the first side and the second side;
a frame, wherein the frame comprises:
two or more first legs, and wherein each of the first legs comprises:
a first end; and
a second opposing end disposed more proximate a ground on which the first linkable shelving assembly is disposed than the first end;
optionally, two or more second legs, wherein each of the second legs comprises:
a first end; and
a second opposing end disposed more proximate a ground on which the linkable shelving assembly is disposed than the first end; and
a plurality of slots disposed as one or more first column of slots and one or more second column of slots; and wherein at least one side of each of the first legs includes at least one of the first columns of slots and at least one of the second columns of slots, and wherein at least one side of each of the second legs includes at least one of the first columns of slots and at least one of the second columns of slots;
wherein the frame is at least partially supported by two or more of the first legs;
and wherein the frame is at least partially supported by:
two or more of the first legs of an adjacent linkable shelving assembly
or by two or more of the second legs;
a top panel disposed proximate the first end of at least two of the first legs; and
a plurality of side panels, wherein one of the side panels comprises a first side panel, and wherein the first side panel is coupled to one or more slots of at least two of the first legs, wherein the first side panel includes an inner surface and an outer surface, and wherein an inner surface of the first side panel encloses the first linkable shelving assembly on a first side, and wherein one of the side panels comprises a second side panel, wherein the second side panel comprises at least one of:
a panel coupled to one or more slots of at least two of the second legs or the first side panel of the adjacent shelving assembly;
at least one shelf, wherein the at least one shelf extends between the first side and the second side along a third axis, wherein the first axis is approximately parallel to the third side, and wherein the at least one shelf is coupled at a first end to one or more slots of the first column of slots in each of the first legs, and wherein the at least one shelf is coupled at a second end to at least one of:
one or more slots of the second column of slots in each of the first legs of an adjacent linkable shelving assembly
or one more slots of the first column of slots in each of the second legs;
and wherein one of the sides of each of the first legs is configured to couple with at least one of the side panels, at least one of the shelves, and with at least one shelf of the adjacent linkable shelving assembly via at least one of:
one of the first columns of slots
or one of the second columns of slots.

18. The modular shelving system of claim 17 further comprising at least one of a desk or a bench extending from the one or more linkable shelving assemblies, wherein the at least one of a desk or a bench is coupled at one end to at least one of the linkable shelving assemblies, and wherein the at least one desk or bench is proximate an outer surface of at least one of the side panels.

19. The modular shelving system of claim 17, wherein the outer surface of one or more of the side panels comprises at least one of:
   a bracket configured to support and secure an electronic media device against the outer surface of the one or more side panels
   or an exterior media shelf proximate the outer surface the one or more side panels.

20. The modular shelving system of claim 17 further comprising one or more elongated brackets extending from one or more channels, wherein the one or more channels are disposed in at least one of a lower surface of the top panel or a lower surface of at least one of the shelves.

* * * * *

UNITED STATES PATENT AND TRADEMARK OFFICE
CERTIFICATE OF CORRECTION

PATENT NO. : 10,342,332 B2
APPLICATION NO. : 15/810608
DATED : July 9, 2019
INVENTOR(S) : Richard Kassanoff et al.

It is certified that error appears in the above-identified patent and that said Letters Patent is hereby corrected as shown below:

In the Claims

Claim 17, Column 12, occurring at the beginning of Line 47, the words "third axis" should read -- first axis --.

Signed and Sealed this
Fifth Day of May, 2020

Andrei Iancu
*Director of the United States Patent and Trademark Office*